(12) United States Patent
Andreas

(10) Patent No.: US 7,468,105 B2
(45) Date of Patent: Dec. 23, 2008

(54) CMP CLEANING COMPOSITION WITH MICROBIAL INHIBITOR

(75) Inventor: Michael T. Andreas, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 264 days.

(21) Appl. No.: 09/981,431

(22) Filed: Oct. 16, 2001

(65) Prior Publication Data

US 2003/0089891 A1    May 15, 2003

(51) Int. Cl.
*B08B 3/00* (2006.01)

(52) U.S. Cl. .............................. 134/2; 134/1.3; 134/26; 134/28; 134/902; 438/745; 438/754; 438/756; 438/757

(58) Field of Classification Search ................. 577/175, 577/178, 108, 405; 438/745, 754, 756, 757
See application file for complete search history.

(56) References Cited

U.S. PATENT DOCUMENTS

| | | | |
|---|---|---|---|
| 4,269,654 A | 5/1981 | Deckert et al. | |
| 4,655,955 A * | 4/1987 | Jetcheva et al. | 510/269 |
| 4,772,501 A * | 9/1988 | Johnson et al. | 428/74 |
| 4,912,021 A * | 3/1990 | Dhillon et al. | |
| 5,141,803 A * | 8/1992 | Pregozen | |
| 5,599,555 A * | 2/1997 | El-Nokaly | 424/488 |
| 5,679,169 A | 10/1997 | Gonzales et al. | 134/1.3 |
| 5,855,811 A | 1/1999 | Grieger et al. | 252/79.3 |
| 5,855,948 A | 1/1999 | Mills et al. | 426/599 |
| 5,866,182 A | 2/1999 | Exner et al. | 426/330.3 |
| 5,981,454 A | 11/1999 | Small | |
| 5,989,353 A | 11/1999 | Skee et al. | |
| 6,044,851 A | 4/2000 | Grieger et al. | 134/1.3 |
| 6,146,468 A | 11/2000 | Dryer et al. | 134/10 |
| 6,147,002 A | 11/2000 | Kneer | 438/692 |
| 6,156,661 A | 12/2000 | Small | 438/692 |
| 6,165,956 A | 12/2000 | Zhang et al. | 510/175 |
| 6,194,317 B1 | 2/2001 | Kaisaki et al. | |
| 6,242,165 B1 * | 6/2001 | Vaartstra | 430/329 |
| 6,265,781 B1 | 7/2001 | Andreas | 257/765 |
| 6,269,511 B1 | 8/2001 | Andreas et al. | 15/77 |

(Continued)

OTHER PUBLICATIONS

Van Zant, Peter, *Microchip Fabrication: A Practical Guide to Semiconductor Processing*, Fourth Edition, p. 91, 2000.

*Primary Examiner*—Michael Barr
*Assistant Examiner*—Rita R Patel
(74) *Attorney, Agent, or Firm*—Whyte Hirschboeck Dudek SC

(57) ABSTRACT

An antimicrobial cleaning composition and methods for cleaning semiconductor substrates, particularly after chemical mechanical planarization or polishing, are provided. In one embodiment, the cleaning composition combines a solvent, a cleaning agent such as a hydroxycarboxylic acid or salt thereof, and at least one antimicrobial agent resulting in a cleaning composition in which microbial growth is inhibited. Examples of suitable antimicrobial agents include a benzoic acid or salt such as potassium or ammonium benzoate, and sorbic acid or salt such as potassium sorbate. The composition is useful for cleaning a wafer and particularly for removing residual particles after a conductive layer has been planarized to a dielectric layer under the conductive layer in a chemical mechanical planarization of a semiconductor wafer with abrasive slurry particles, particularly after a CMP of copper or aluminum films. Use of the cleaning composition advantageously inhibits microbial growth in the cleaning solution and deposition on the cleaned planarized surface.

59 Claims, 1 Drawing Sheet

U.S. PATENT DOCUMENTS

| | | |
|---|---|---|
| 6,273,100 B1 | 8/2001 | Andreas et al. .............. 134/1.3 |
| 6,468,951 B1 | 10/2002 | Grieger et al. |
| 2001/0023127 A1 | 9/2001 | Andreas |
| 2002/0142584 A1 | 10/2002 | Andreas |
| 2002/0187906 A1 | 12/2002 | Yates et al. |
| 2003/0022568 A1* | 1/2003 | Branham et al. .............. 442/59 |
| 2004/0214797 A1* | 10/2004 | Lyons et al. .................. 514/58 |

* cited by examiner

CMP CLEANING COMPOSITION WITH MICROBIAL INHIBITOR

FIELD OF THE INVENTION

The present invention relates generally to the field of semiconductor device fabrication, and more particularly to cleaning a surface of a semiconductor substrate, including a substrate that has been subjected to chemical mechanical polishing or planarizing.

BACKGROUND OF THE INVENTION

The use of copper metallization in semiconductor devices is becoming more preferred as a replacement for aluminum. The lower resistivity of copper versus aluminum (<2 μΩ-cm versus >3 μΩ-cm) enables smaller line widths and depths. Thinner metal lines also reduce capacitance between lines, reducing overall power consumption. Because copper is difficult to dry etch, damascene or dual-damascene integration schemes are preferred.

FIG. 1 illustrates a portion of a semiconductor wafer 10 comprising a substrate 12, a dielectric layer 14 such as silicon dioxide ($SiO_2$), phosphosilicate glass (PSG), borosilicate glass (BSG), and borophosphosilicate glass (BPSG), with vias/trenches 16 etched into the dielectric layer 14. A thin layer 18 of a barrier material (e.g., tantalum, titanium, or titanium nitride) is deposited over the dielectric layer and into the openings 16. A copper layer 20 is then deposited over the barrier layer 18 by conventional methods such as chemical vapor deposition (CVD), physical vapor deposition (PVD), and electroplating, to fill the openings 16.

To electrically isolate the copper interconnects, excess copper layer 20 and barrier layer 18 is removed, typically by chemical mechanical polishing or planarization (CMP), as shown in FIG. 2. CMP processes are abrasive techniques that are frequently used to remove material from or planarize the surface layers of a wafer during fabrication of integrated circuit devices. Typically, a wafer is pressed against a polishing pad in a slurry solution under controlled conditions. The slurry solution generally contains abrasive particles that mechanically remove the surface layer and may contain chemical agents, such as an oxidant such as hydrogen peroxide, and abrasive particles such as aluminum oxide (alumina), titanium dioxide, silicon dioxide, and/or cerium dioxide, that abrade the surface layer. Planarizing the wafer produces residual particles 24 including metal particle accumulations, residual abrasive slurry particles, and other types of residual particles that are generally loose and unattached to the planarized surface 26. Surface attraction can vary, and some particles may be embedded in the surface 26.

After a CMP process, the planarized surface layer 26 is then cleaned to remove residual chemicals and particles that remain on the wafer surface. Post-planarization cleaning can be performed using various methods depending on the composition of the layer and any residual chemicals and particles that may be present. The cleaning methods are generally wet cleaning processes that include chemical cleaning, mechanical scrubbing, and other surface agitation techniques. The objective in the cleaning process is to provide a wafer surface that is free of slurry particles, organic residues and trace metals ions, without introducing defects to the wafer surface.

The current technology for metal CMP post-cleaning uses mechanical brush scrubbers in conjunction with deionized water and/or cleaning solutions, and/or immersion in a vibrational bath. In an exemplary process, the CMP wafers are rinsed, immersed in a megasonics bath, and then subjected to double-sided brush scrubbing using a cleaning solution to scrub both sides of the wafer.

Cleaning wafers after copper CMP presents various challenges, including issues of corrosion and particle removal that must be addressed. Aluminum CMP post-cleans that utilize ozonated deionized (DI) water or other oxidizing media passivation between polish and post-cleans, are not functional for a copper CMP post-clean because of high copper corrosion rates in such media. Processing of copper CMP wafers using a low-pH aluminum scrub leaves high levels of alumina slurry residuals, which can cause problems such as brush loading (i.e., adherence of alumina particles to the brush). In addition, exposure to DI water must be minimized for copper CMP polished lots to prevent deionized (DI) water corrosion.

A cleaning solution comprising dilute ammonium citrate can be used for copper CMP post-clean processes. One example of a copper CMP cleaning solution comprises water, an ammonium salt of a hydroxycarboxylic acid such as ammonium citrate, a dicarboxylic acid such as oxalic acid and malonic acid, and optionally a small amount of ammonia fluoride or hydrofluoric acid, in an acidic pH of about 3.0 to about 6.0. Ammonium citrate solutions have been found to disperse alumina and silica slurry particles, and do not promote corrosion of copper. In addition, such solutions are relatively inexpensive.

However, a drawback of ammonium citrate cleaning solutions is their nutritional appeal to certain strains of bacteria, for example, *Bacillus* sp. Cleaning agents such as ammonium citrate can support microbial activity and/or growth in solution. If present in the cleaning media, such bacteria can be carried to the wafer during processing. Once there, biosorption of bacteria to the copper surface can make removal of the bacteria very difficult. Such bacterial contamination can be detected, for example, by SEM inspection.

One potential technique to remove bacterial contamination is to remove organic contaminants with a peroxide flush of the system. However, residual peroxide in the lines can result in copper erosion.

Therefore, it would be desirable to provide a cleaning composition that inhibits growth of bacteria in the solution without hampering the process performance of the solution.

SUMMARY OF THE INVENTION

The present invention provides a cleaning composition and methods for cleaning semiconductor substrates, particularly after chemical mechanical planarization or polishing (CMP) of copper or aluminum films, and inhibiting the bacterial growth on the planarized substrates.

In one aspect, the present invention provides a cleaning composition. In one embodiment, the cleaning composition combines a solvent, a cleaning agent, and at least one antimicrobial agent, for cleaning the surface of a semiconductor substrate. The cleaning agent comprises a hydroxycarboxylic acid and/or salt thereof, for example, citric acid and citric acid salts such as ammonium citrate and tetraalkylammonium citrate. Such cleaning agents are useful for dispersing alumina or silica slurry particles from a semiconductive substrate, but also support microbial activity or growth. The antimicrobial agent inhibits microbial activity or growth within the cleaning composition. The antimicrobial agent is preferably benzoic acid, sorbic acid, a salt of such acids, or a mixture thereof. The solvent is preferably deionized water, although an organic solvent can also be used. The composition preferably has an acidic pH of about 4.5 to about 6.5. The cleaning composition can comprise a pH buffering agent such as ammonium hydroxide and tetraalkylammonium hydroxide, to adjust the pH of the mixture.

In one embodiment, the cleaning composition comprises a mixture of a cleaning agent and an antimicrobial agent in amounts relative to one another such that microbial growth within the cleaning composition is inhibited, and when the composition is in contact with both a metal conductive structure and a dielectric layer, residual particles are removed therefrom with no significant defects to the conductive structure or the dielectric layer, and microbial deposition on the cleaned surface is inhibited.

In another aspect, the invention provides methods for cleaning a semiconductor substrate. In one embodiment, the method comprises contacting a surface of the semiconductor wafer with a cleaning composition according to the invention that comprises a cleaning agent and an antimicrobial agent at a temperature and a time effective to clean the semiconductor wafer surface. Use of the cleaning composition results in inhibited microbial growth in the cleaning solution and therefore minimizing bacterial residue on the cleaned surface of the semiconductor wafer.

In another embodiment, the method of the invention is directed to cleaning planarized surfaces of a semiconductor wafer having metallic features (conductive features) such as interlayer connectors or conducting lines. The surface can comprise, for example, a metal such as copper, aluminum, platinum, titanium, silver, tungsten and/or tantalum, a dielectric such as silica, borophosphosilicate glass (BPSG), borosilicate glass (BSG), or phosphosilicate glass, carbon-doped silica, porous silica, and/or a low k dielectric such as silicon dioxide deposited by plasma enhanced chemical vapor deposition (PECVD), a spin-coat process, or decomposition from a tetraethylorthosilicate (TEOS) precursor. After such a wafer has been planarized, residual particles, for example, from the slurry, metal features, dielectric material, pad and wafer, remain loose on the planarized surface.

The method comprises contacting the planarized surface of the wafer with a cleaning solution comprising a cleaning agent and an antimicrobial agent, at a temperature and for a time effective to remove at least a portion of the residual particles from the planarized surface of the wafer. In an embodiment of the method, the cleaning composition is applied to a semiconductor substrate after the formation of copper or aluminum interconnects and a CMP of the interconnects.

The method provides a post-CMP cleaning process that removes residual copper or aluminum accumulations, other residual metals such as platinum, titanium and tantalum, particles of alumina, silica or other abrasive particles, and other particles from the surface of a wafer, and further provides an antimicrobial action to prevent growth of bacteria and other microbes which can otherwise deposit on the surface of the cleaned substrate.

The wafer can be contacted with the cleaning composition, for example, by spraying the wafer with the cleaning composition, flowing the cleaning composition over the wafer, and/or placing the wafer in a solvent bath containing the cleaning composition including dipping the wafer in the bath. In the use of a bath of the cleaning composition, at least a portion of the wafer substrate can be submerged in the bath for a time effective to clean the surface of the substrate. The submerged portion can be brought into frictional contact with a brush or polishing pad to remove residual particles from the planarized surface by scrubbing to clean the surface of the substrate. A vibrational energy can also be imparted to the solvent bath to remove residual particles from the planarized surface. In addition, the semiconductor substrate can be placed in a brush cleaning tool wherein the wafer surface is scrubbed while contacting the cleaning composition.

BRIEF DESCRIPTION OF THE DRAWINGS

Preferred embodiments of the invention are described below with reference to the following accompanying drawings, which are for illustrative purposes only. Throughout the following views, the reference numerals will be used in the drawings, and the same reference numerals will be used throughout the several views and in the description to indicate same or like parts.

DETAILED DESCRIPTION OF THE PREFERRED EMBODIMENTS

Figure 1:
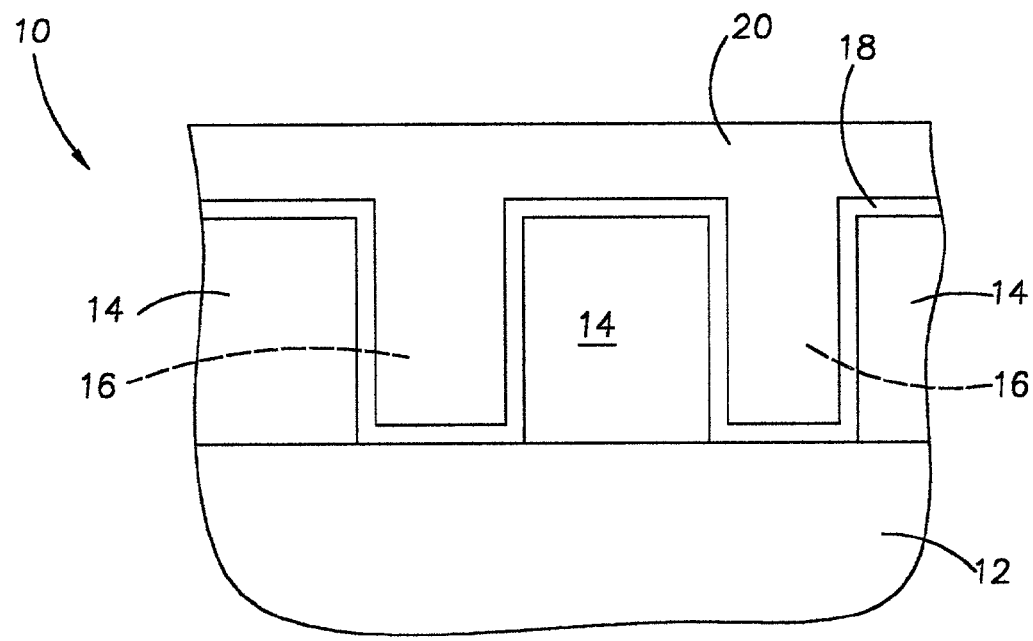
FIG. 1 is a diagrammatic cross-sectional view of a prior art semiconductor wafer fragment at a preliminary step of a CMP processing sequence.
Figure 2:
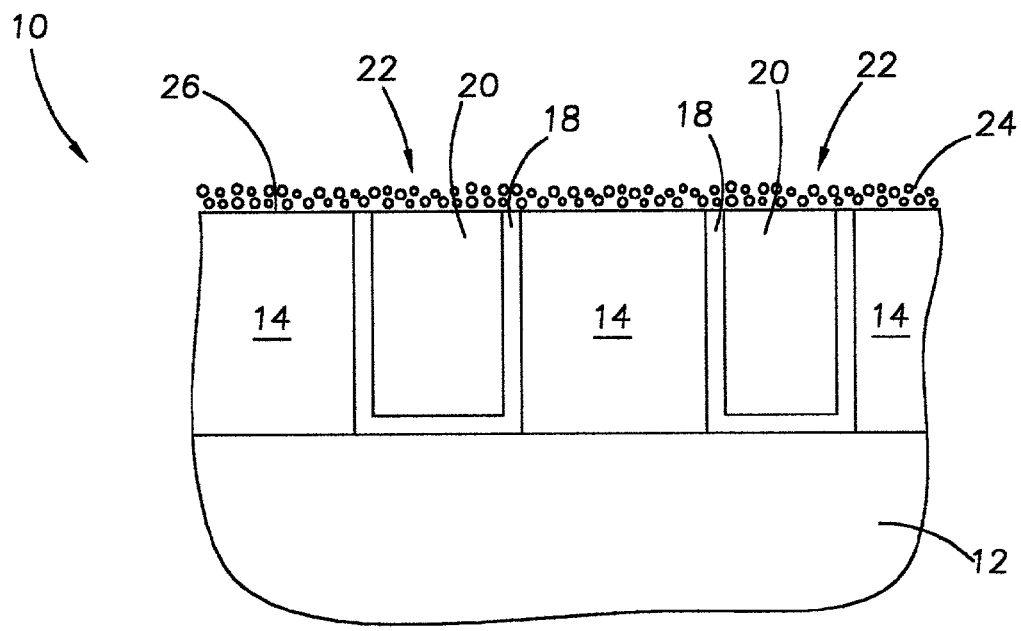
FIG. 2 is a view of the wafer fragment of FIG. 1 after a CMP process step showing residual particles on the planarized surface.

The present invention provides cleaning processing and compositions for removing residual particles remaining after polishing metal-containing layers, particularly for cleaning polished surfaces of copper or aluminum features such as interlayer connectors (interconnects) or conducting lines. In particular, the present invention provides an antimicrobial cleaning composition that is formulated to inhibit microbial growth within the composition and minimize deposition of microbes onto polished metal features and planarized surfaces that can result from the use of cleaning compositions containing hydroxycarboxylic acids and/or salts thereof such as citric acid and/or citric acid salts, in a post-CMP cleaning process.

The invention will be described for the purpose of illustrating the present preferred embodiments only and not for purposes of limiting the same. The processing steps described herein are used in the fabrication of semiconductor devices in accordance with the present invention. It should be readily apparent that the processing steps are only a portion of the entire process flow for manufacturing integrated circuit (IC) devices.

In the current application, the terms "semiconductive wafer fragment" or "wafer fragment" or "wafer" will be understood to mean any construction comprising semiconductor material, including but not limited to bulk semiconductive materials such as a semiconductor wafer (either alone or in assemblies comprising other materials thereon), and semiconductive material layers (either alone or in assemblies comprising other materials). The term "substrate" refers to any supporting structure including, but not limited to, the semiconductive wafer fragments or wafers described above. All percentages are by weight unless otherwise indicated.

As described hereinabove, planarizing the wafer 10 produces residual particles 24 on the planarized surface 26. Target contaminants of which the cleaning composition and method of the present invention are useful in removing include, particularly, copper (Cu), aluminum (Al), platinum (Pt), tungsten (W), silver (Ag), titanium (Ti), and tantalum (Ta), and oxides that are used as abrasive particles, including alumina, silica, and similar particulates.

In one embodiment, the cleaning composition of the invention comprises a mixture in the form of a solution comprising a cleaning agent, one or more antimicrobial agents, and solvent, in amounts relative to one another such that microbial growth is inhibited within the aqueous solution, and when the composition is in contact with a copper or aluminum conductive feature and a dielectric layer, residual particles and contaminants are removed therefrom with no significant defects to the metal feature or the dielectric layer, and bacterial and other microbial growth and deposition on the contacted surfaces is inhibited.

The cleaning agent comprises an organic compound that provides an effective negative zeta potential for critical surfaces such as slurry particles, wafer surface and brush surface, such that the electrostatic forces between the residual particles and the planarized surfaces are made repulsive, causing the particles to form a dispersion in the cleaning solution and be removed from the planarized surface. Examples and preferred cleaning agents comprise hydroxycarboxylic acids such as citric acid, malic acid (hydroxysuccinic acid), tartaric acid, glycolic acid, lactic acid, tartronic acid (hydroxypropanedioic acid), and salts of such acids. Preferred hydroxycarboxylic acid salts include ammonium citrate (mono- or dibasic), and tetraalkylammonium citrates (mono- or dibasic) such as tetramethylammonium citrate, tetraethylammonium citrate, tetrabutylammonium citrate, tetrapropylammonium citrate, ammonium hydrogen malate, ammonium tartrate, ammonium glycolate, ammonium lactate, ammonium tartronate, among others. The use of the foregoing hydroxycarboxylic acids and salts as a dispersant provides a desirable performance of the cleaning composition in effectively removing contaminants and residual particles such as alumina and silica slurry particles, particularly in the use of a brush cleaning tool, and also provides an environment that minimizes copper/aluminum corrosion.

An antimicrobial agent is included in the cleaning composition to inhibit growth of *Bacillus* sp. and other bacteria, mold and other microbes, within the cleaning composition and on the surface of the cleaned substrate and planarized features.

Examples and preferred antimicrobial agents include sorbic acid, benzoic acid, and salts of such acids including, for example, ammonium benzoate, potassium benzoate, a tetraalkylammonium benzoate such as tetramethylammonium benzoate, ammonium sorbate, potassium sorbate, a tetraalkylammonium sorbate such as tetramethylammonium sorbate; alkyl parahydroxybenzoates such as methylparahydroxybenzoate (methylparaben), ethylparahydroxybenzoate (ethylparaben), propylparahydroxybenzoate (propylparaben), n-heptylparahydroxybenzoate (heptylparaben), and similar esters; sulfites such as sulfur dioxide, potassium bisulfite, and potassium metabisulfite; and mixtures thereof. A preferred antimicrobial agent comprises a mixture of potassium sorbate and at least one of ammonium benzoate and potassium benzoate.

The solvent is preferably water, but can also be an organic solvent, or a combination thereof. Suitable organic solvents include methanol, ethanol, n-propanol, iso-propanol, n-butanol, t-butanol, sec-butanol, ethylene glycol, propylene glycol, and other like hydroxyl-containing solvents. Preferably, the cleaning composition is an aqueous mixture of the cleaning agent and the antimicrobial agent in water, preferably deionized (DI) water.

The composition preferably has a pH of about 4.5 to about 6.5, preferably a pH of about 5 to about 6. If the pH of the cleaning composition becomes too high or too low, the cleaning ability of the composition can be impaired and the passivating ability, or ability of the solution to maintain an environment that protects the exposed copper (or aluminum) structures, can be hindered. The pH of the cleaning composition can be adjusted to the preferred range by adjusting the relative composition with respect to primary acidic or basic constituents. These may include citric acid, ammonium hydroxide or a tetraalkylammonium hydroxide such as tetramethylammonium hydroxide.

Optional components include a surfactant to help disperse the residual particles and make them easier to remove. Surfactants useful in the cleaning composition include, for example, betaines and sulfobetaines such as alkyl betaines, amidoalkyl betaines, alkyl sulfobetaines, and amidoalkyl sulfobetaines; aminocarboxylic acid derivatives such as amphoglycinates, amphopropionates, amphodiglycinates, and amphodipropiones; amine oxides such as alkyl amine oxides and alkylamido alkylamine oxides; fluoroalkyl sulfonates and fluorinated alkyl amphoterics; ethoxylates such as ethoxylated alkylmethyl quaternary ammonium chloride, ethoxylated polyoxypropylene, and polyoxyethylene nonylphenyl ether phosphate; quaternary ammonium salts such as cetyltrimethyl ammonium bromide; and mixtures thereof. An example and preferred surfactant is Rhodafac RE-610, manufactured by Ashland Chemical Company.

Although not preferred, additional additives can be added to the cleaning composition. For example, a corrosion inhibitor such as benzotriazole (BTA), can be included to enhance corrosion inhibition. Other additives include chelating agents such as EDTA; oxidants such as ozone, hydrogen peroxide and the like; antioxidants such as ascorbic acid or its salt; and the like.

The antimicrobial cleaning compositions of the invention can be prepared by combining, in any order, the cleaning agent, the antimicrobial agent(s), and the solvent, and optional additives as desired. A hydroxycarboxylic acid salt such as a citric acid salt can be added in the form of a solution, preferably an about 5% to about 20% solution, and more preferably an about 10% solution.

In one embodiment, the cleaning composition is an acidic solution comprising about 0.02 to about 1.5% by weight of a cleaning agent, about 0.005 to about 0.3% by weight of an antimicrobial agent, with the balance being water or other solvent, the % by weight amounts based on the total weight of the cleaning composition. In a preferred embodiment, the cleaning composition comprises about 0.05 to about 0.5% by weight of a cleaning agent, about 0.01 to about 0.2% by weight of an antimicrobial agent, and about 90 to about 99% by weight solvent. In a further preferred embodiment, the cleaning composition comprises about 0.1 to about 0.2% by weight of a cleaning agent, about 0.03 to about 0.1% by weight of an antimicrobial agent, and about 99% by weight solvent.

An example and preferred embodiment of the cleaning composition is an aqueous acidic solution comprising about 0.1 to about 0.2% by weight of a cleaning agent comprising a hydroxycarboxylic acid or salt thereof, preferably citric acid or a citric acid salt, and preferably ammonium citrate (from a 10% solution); the antimicrobial agent as a mixture of about 0.03 to about 0.1% by weight each of ammonium benzoate and potassium benzoate with about 0.03 to about 0.1% by weight of potassium sorbate or ammonium sorbate; and the balance deionized water.

The amounts of the components can vary depending on the type of equipment used in the cleaning process. For example, in a scrubber, polisher or offload station, the cleaning solution supply tank can contain about 20 liters solution containing about 200 ml of a 10% ammonium citrate solution (0.1% by weight), about 6 g potassium sorbate (0.03% by weight), and about 6 g potassium benzoate (0.03% by weight), and the balance DI water. For a megasonic tank, the recirculating cleaning solution can contain the same solution, or active ingredients up to 10 times the concentration used in spray applications.

An embodiment of a method of the invention using the present antimicrobial cleaning composition is described with reference to cleaning a semiconductor substrate having planarization residue after the formation of copper interconnects and a CMP of the copper interconnects. Although described as copper in the illustrated example, the interconnect but can be made from aluminum or other highly conductive material such as silver. It should be noted the processes for forming copper or other metal interconnects in semiconductor device fabrication are well known in the art and, therefore, not described in detailed herein.

As described with reference to FIG. 1, after the copper interconnects on the semiconductor substrate have been planarized by CMP, the substrate is cleaned to remove contaminants from the surface of the substrate. It is noted that the wafer fragment 10, illustrated in FIG. 1, can comprise a semiconductor wafer substrate or the wafer along with various process layers formed thereon, including one or more semiconductor layers or other formations, and active or operable portions of semiconductor devices.

To remove the residual particles 24, the polished wafers can be processed through a conventional wet cleaning process known and used in the art using the cleaning composition of the invention. Any suitable means or apparatus can be used to carry out the cleaning process according to the invention.

The cleaning composition can be applied to the wafer in various ways. For example, the cleaning composition in the form of a solution can be sprayed onto the substrate, applied to the substrate through brushes, or dripped onto the substrate, among others. The semiconductor wafer can be placed into a bath of the cleaning composition, whereupon planarization residue will become suspended, displaced and/or dissolved in the cleaning composition. A brush can be used in combination with the cleaning composition, to provide a scrubbing action to remove residues from the wafer substrate. Scrubbers for use in the removal of planarization residues are commercially available and well known in the art. The wafer can be subjected to one or more scrubbing steps using the cleaning composition using one- or two-sided brushing, to remove the residual particles and contaminants from the planarized substrate. The cleaning bath and/or the scrubbing apparatus can additionally include ultrasonic or, preferably, megasonic enhancement involving generating a megasonic signal (0.2-5 MHz), to agitate the cleaning solution against the surface of the substrate and dislodge particles from the planarized surfaces. Such apparatus and mechanisms are known in the art, as described, for example, in U.S. Pat. No. 6,273,100 (Andreas et al., to Micron Technology, Inc.). The temperature of the cleaning composition preferably ranges from about 10° C. to about 30° C. The length of the contact of the cleaning composition with the wafer surface preferably ranges from about 15 seconds to about 60 minutes, and preferably about 40 seconds to about 3 minutes. Preferably, the total copper budget at the end of the cleaning process is less than about 50 angstroms erosion.

In an example and preferred process, the wafer is dipped in a megasonic bath comprising the cleaning solution of the invention for about 30 to about 60 seconds at ambient temperature (20-30° C.), and then subjected to one or more scrubbing steps using the cleaning composition and two-sided brushing to remove residual particles from the CMP process.

The cleaning process results in a cleaned planarized surface with metallic features such as interconnects or conducting lines, and inhibited microbial deposition on the planarized surfaces.

The following Examples are provided to illustrate the present invention, and should not be viewed as limiting the invention in any manner.

COMPARATIVE EXAMPLE AND EXAMPLES

Preparation of Cleaning Compositions

Stock solutions of potassium sorbate and potassium benzoate were prepared from dry salts. Mixtures of dilute ammonium citrate with the additive salts were prepared according to Table 2. The resulting stock mixtures contained 1% ammonium citrate with 0.5% sorbate, benzoate, or both sorbate and benzoate, and 1% ammonium citrate with 0.1% sorbate, benzoate, or both sorbate and benzoate. All measurements were by weight.

TABLE 2

Preparation of experimental stock solutions (all weight measurements in grams).

| Solution Name | 10% ammonium citrate | 5% potassium sorbate | 5% potassium benzoate | Total Weight |
| --- | --- | --- | --- | --- |
| A | 10.02 | 9.99 | 0.00 | 100.0 |
| B | 10.02 | 1.99 | 0.00 | 100.1 |
| C | 10.03 | 0.00 | 9.97 | 100.0 |
| D | 10.03 | 0.00 | 2.00 | 100.1 |
| E | 10.30 | 9.75 | 9.96 | 100.5 |
| F | 10.13 | 1.96 | 1.98 | 100.2 |

Copper Corrosion

Copper post-CMP cleans were performed using a 0.1% ammonium citrate cleaning solution. To measure corrosion of copper in the experimental solutions, each mixture was diluted 10:1. Solutions of 0.1% ammonium citrate (without additives) and neat DI water were used for comparison. Each sample was measured for pH. All pH measurements were within the desired region of the Pourbaix diagram for copper cleaning (adapted from Beverskog and Puigdomenech, *J. Electrochem. Soc.* 144:3476-83 (1997)).

To test for copper corrosion, small segments of polished copper test wafer were immersed in each solution for 90 minutes under ambient conditions. Each solution was analyzed by inductively coupled plasma mass spectrometer (ICP-MS) for dissolved copper. The test pieces were cross-sectioned for SEM inspection of the copper surface.

Table 3 summarizes the sample preparation, pH and ICP-MS results for this test, along with estimated etch rates based on the ICP-MS results. Although the DI water sample had the lowest measurable dissolved copper, it showed distinctive edge corrosion by SEM because the corrosion product (copper oxide) is soluble in acidic media but not very soluble in DI water. Overall, every ammonium citrate mixture corrosion test piece looked similar to the non-processed wafer piece. The results indicated that all modified cleaning solutions met engineering requirements of minimal copper corrosion.

TABLE 3

Experimental setup and results for corrosion dip tests.

| Solution | % Citrate/ Sorbate/ Benzoate | Cu Sample Wt. | Soln Wt. | pH | Cu Conc. (ppm) | Corrosion Rate (Å/min.) |
|---|---|---|---|---|---|---|
| A/10 | 0.1/0.05/0 | 1.0759 | 8.387 | 5.24 | 0.786 | 0.42 |
| B/10 | 0.1/0.01/0 | 1.0012 | 7.643 | 5.08 | 1.49 | 0.67 |
| C/10 | 0.1/0/0.05 | 1.0636 | 8.518 | 5.08 | 1.32 | 0.74 |
| D/10 | 0.1/0/0.01 | 1.4199 | 10.914 | 5.10 | 1.6 | 1.46 |
| E/10 | 0.1/0.05/0.05 | 1.0662 | 9.973 | 5.27 | 0.564 | 0.35 |
| F/10 | 0.1/0.01/0.01 | 1.1582 | 12.026 | 5.12 | 1.46 | 1.20 |
| Control | 0.1/0.01/0.01 | 1.0426 | 8.223 | 5.00 | 2.26 | 1.14 |
| DI | 0/0/0 | 1.0138 | 10.026 | 7.00 | 0.178 | 0.11 |

Particle Dispersion

For the particle dispersion test, 100 ml samples of modified cleaning solution (at 0.1% nominal ammonium citrate concentration) were prepared. To each sample was added 1.00 ml of alumina slurry. This quantity was in excess of the amount of alumina that can be dispersed by the cleaning solution, therefore saturating the dispersion power of each solution. Each solution was agitated, then set aside. At specific intervals, the supernatant of each mixture was sampled and analyzed by inductively coupled plasma optical emission spectrometer (ICP-OES) for aluminum. The raw data are given in Table 4. A plot of normalized dispersion (relative to the 0.1% control ammonium citrate) versus time was made. All experimental solutions dispersed alumina as well as the control solution within the testing period. The raw values at 7 days was higher than 4 days, which could have been due to accidental agitation, loss of sample volume, or internal evaporation/condensation. The results indicated that all modified solutions met engineering requirement of dispersing alumina slurry particles.

TABLE 4

ICP-OES measurement of dispersed alumina. All values are ng/g aluminum.

| Sample | 0 Days | 1 Day | 2 Days | 4 Days | 7 Days |
|---|---|---|---|---|---|
| A/10 | 46250 | 4390 | 6270 | 7668 | 15545 |
| B/10 | 34500 | 5060 | 5490 | 7653 | 16250 |
| C/10 | 46500 | 4800 | 6170 | 7612 | 10540 |
| D/10 | 41000 | 4800 | 6240 | 7550 | 10780 |
| E/10 | 47000 | 5300 | 6440 | 7861 | 10270 |
| F/10 | 35250 | 4900 | 6380 | 7825 | 10990 |
| CTRL | 33000 | 5170 | 5880 | 7722 | 10590 |

SUMMARY

Beaker-level tests confirmed that salts of sorbic acid and benzoic acid can be added to ammonium citrate without adversely impacting the particle-dispersing or low copper etch rate properties of an ammonium citrate post-CMP cleaning solution. Dilute salts of sorbic acid and benzoic acid can be added to ammonium citrate to inhibit the growth of bacteria in the cleaning solution. Particle dispersion and copper corrosion tests at the beaker level showed compatibility of the spiked solutions with the current performance criteria of the original ammonium citrate solution.

Subsequent tests in the process tool has shown a decreased incidence of bacterial residue found by inspection of polished wafers.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. A cleaning composition for a semiconductor substrate, consisting essentially of: effective amounts of a cleaning agent at about 0.02-1.5% by wt and an antimicrobial agent at about 0.005-0.3% by wt and selected from the group consisting of benzoic acid, sorbic acid, and salts thereof, a solvent at about 90-99% by wt, and an amount of buffering agent for a pH of about 5-6.5, the % by wt based on the total weight of the composition.

2. The cleaning composition of claim 1, wherein the cleaning agent comprises a hydroxycarboxylic acid, a hydroxycarboxylic acid salt, or a mixture thereof.

3. The cleaning composition of claim 2, wherein the cleaning agent comprises a hydroxycarboxylic acid selected from the group consisting of citric acid, malic acid, tartaric acid, glycolic acid, lactic acid, and tartronic acid.

4. The cleaning composition of claim 2, wherein the cleaning agent comprises a hydroxycarboxylic acid salt selected from the group consisting of a citric acid salt, malic acid salt, tartaric acid salt, glycolic acid salt, lactic acid salt, and tartronic acid salt.

5. The cleaning composition of claim 2, wherein the cleaning agent is selected from the group consisting of citric acid and citric acid salts.

6. The cleaning composition of claim 5, wherein the cleaning agent comprises a citric acid salt selected from the group consisting of ammonium citrate, and a tetraalkylammonium citrate.

7. The cleaning composition of claim 1, wherein the antimicrobial agent comprises a sorbic acid salt selected from the group consisting of ammonium sorbate, potassium sorbate, and tetraalkylammonium sorbate.

8. The cleaning composition of claim 1, wherein the antimicrobial agent is selected from the group consisting of benzoic acid, sorbic acid, ammonium benzoate, potassium benzoate, tetraalkylammonium benzoate, potassium sorbate, ammonium sorbate, and tetraalkylammonium sorbate.

9. The cleaning composition of claim 1, wherein the buffering agent is selected from the group consisting of ammonium hydroxide, and tetraalkylammonium hydroxide.

10. A cleaning composition for a semiconductor substrate, consisting essentially of: a cleaning agent selected from the group consisting of hydroxycarboxylic acids and salts thereof, an antimicrobial agent in an amount effective to inhibit microbial growth in the cleaning composition and selected from the group consisting of benzoic acid, sorbic acid, and salts thereof, solvent at about 90-99% by wt, and an amount of a pH buffering agent for a pH of about 5 to about 6.5, the % by wt based on the total weight of the composition.

11. The cleaning composition of claim 10, wherein the cleaning agent is selected from the group consisting of citric acid, malic acid, tartaric acid, glycolic acid, lactic acid, tartronic acid, and salts thereof.

12. The cleaning composition of claim 11, wherein the cleaning agent is selected from the group consisting of citric acid, ammonium citrate, and tetraalkylammonium citrate.

13. The cleaning composition of claim 10, wherein the antibacterial agent comprises a sorbic acid salt selected from the group consisting of potassium sorbate, ammonium sorbate, and tetraalkylammonium sorbate.

14. The cleaning composition of claim 10, wherein the solvent is selected from the group consisting of water, and an organic solvent.

15. The cleaning composition of claim 13, wherein the solvent comprises deionized water.

16. A cleaning composition for a semiconductor substrate, consisting essentially of a cleaning agent selected from the group consisting of citric acid and a citric acid salt, an effective amount of an antimicrobial agent at about 0.005-0.3% by wt to inhibit microbial growth in the cleaning composition and selected from the group consisting of benzoic acid, sorbic acid, and salts thereof, solvent at about 90-99% by wt, and an amount of a pH buffering agent for a pH of about 5 to about 6.5, the % by wt based on the total weight of the composition.

17. The cleaning composition of claim 16, wherein the antimicrobial agent comprises a sorbic acid salt selected from the group consisting of ammonium sorbate, potassium sorbate, tetraalkylammonium sorbate.

18. A cleaning composition for a semiconductor substrate, consisting essentially of: a cleaning agent capable of dispersing alumina or silica slurry particles and supporting microbial growth in an of about 0.02-1.5% by wt, an antimicrobial agent present in an amount of about 0.005-0.3% by wt being effective to inhibit bacterial growth in the cleaning composition and on the surface of the substrate when the composition is applied thereto, effective amounts of one or more of a surfactant, buffering agent, corrosion inhibitor, chelating agent, oxidizing agent and antioxidant, and about 90-99% by wt solvent, the composition having a pH of about 5-6.5, wherein the antimicrobial agent is selected from the group consisting of benzoic acid, sorbic acid, and salts thereof, the % by wt based on the total weight of the composition.

19. The cleaning composition of claim 18, wherein the cleaning agent comprises a hydroxycarboxylic acid selected from the group consisting of a hydroxycarboxylic acid, and hydroxycarboxylic acid salts.

20. The cleaning composition of claim 19, wherein the cleaning agent is selected from the group consisting of citric acid, malic acid, tartaric acid, glycolic acid, lactic acid, and tartronic acid.

21. The cleaning composition of claim 19, wherein the cleaning agent comprises citric acid or a salt thereof.

22. The cleaning composition of claim 21, wherein the cleaning agent comprises a citric acid salt selected from the group consisting of ammonium citrate, and tetraalkylammonium citrate.

23. The cleaning composition of claim 22, wherein the cleaning agent comprises tetramethylammonium citrate.

24. The cleaning composition of claim 18, wherein the antimicrobial agent is selected from the group consisting of benzoic acid, sorbic acid, ammonium benzoate, potassium benzoate, tetraalkylammonium benzoate, ammonium sorbate, potassium sorbate, and tetraalkylammonium sorbate.

25. A cleaning composition for a semiconductor surface, comprising an aqueous composition consisting essentially of:
about 0.02 to about 1.5% by weight cleaning agent;
about 0.005 to about 0.3% by weight antimicrobial agent selected from the group consisting of benzoic acid, sorbic acid, and salts thereof;
an effective amount of at least one of a surfactant, buffering agent, corrosion inhibitor, chelating agent, oxidizing agent, and antioxidant; and
the balance solvent;
the composition having a pH of about 5-6.5, and the % by weight based on the total weight of the cleaning composition.

26. The cleaning composition of claim 25, wherein the cleaning agent is selected from the group consisting of hydroxycarboxylic acids and salts thereof.

27. The cleaning composition of claim 26, wherein the cleaning agent is selected from the group consisting of citric acid, malic acid, tartaric acid, lactic acid, glycolic acid, tartronic acid, and salts thereof.

28. The cleaning composition of claim 26, wherein the cleaning agent is selected from the group consisting of citric acid, ammonium citrate, and tetraalkylammonium citrate.

29. The cleaning composition of claim 25, wherein the amount of the cleaning agent is about 0.05 to about 0.5% by weight, and the amount of the antimicrobial agent is about 0.01 to about 0.2% by weight.

30. A cleaning composition for a semiconductor surface, comprising an aqueous mixture consisting essentially of:
about 0.02 to about 1.5% by weight cleaning agent selected from the group consisting of hydroxycarboxylic acids and salts thereof;
about 0.005 to about 0.3% by weight of a first antimicrobial agent selected from the group consisting of benzoic acid and salts thereof;
about 0.005 to about 0.3% by weight of a second antimicrobial agent selected from the group consisting of sorbic acid and salts thereof; and
the balance solvent;
the composition having a pH of about 5-6.5, and the % by weight based on the total weight of the cleaning composition.

31. A cleaning composition for a semiconductor surface, consisting essentially of:
about 0.02 to about 1.5% by weight citric acid, citric acid salt, or a mixture thereof;
about 0.005 to about 0.3% by weight benzoic acid, benzoic salt, or a mixture thereof;
about 0.005 to about 0.3% by weight sorbic acid, sorbic acid salt, or a mixture thereof; and
the balance solvent;
the composition having a pH of about 5-6.5, and the % by weight based on the total weight of the cleaning composition.

32. The cleaning composition of claim 31, wherein the solvent comprises deionized water.

33. A cleaning composition for a semiconductor surface, consisting essentially of:
about 0.02 to about 1.5% by weight of a cleaning agent selected from the group consisting of citric acid, ammonium citrate, and tetraalkylammonium citrate;
about 0.005 to about 0.3% by weight of a first antimicrobial agent selected from the group consisting of benzoic acid, potassium benzoate, ammonium benzoate, and tetraalkylammonium benzoate;
about 0.005 to about 0.3% by weight of a second microbial agent selected from the group consisting of sorbic acid, potassium sorbate, ammonium sorbate, and tetraalkylammonium sorbate; and
the balance solvent;
the composition having a pH of about 5-6.5, and the % by weight based on the total weight of the cleaning composition.

34. A cleaning composition for a semiconductor surface, consisting essentially of: an acidic aqueous solution comprising a cleaning agent selected from the group consisting of citric acid and citric acid salts, one or more antimicrobial agents in an amount effective to inhibit microbial growth in the cleaning composition and selected from the group consisting of a benzoic acid, benzoic acid salts, sorbic acid and sorbic acid salts, solvent comprising water at about 90-99% by wt, and an amount of a pH buffering agent for a pH of about 5-6.5, the % by wt based on the total weight of the composition.

35. The cleaning composition of claim 34, wherein the cleaning agent is a selected from the group consisting of citric acid, ammonium citrate, and tetraalkylammonium citrate.

36. The cleaning composition of claim 34, wherein the antimicrobial agent is selected from the group consisting of benzoic acid, sorbic acid, potassium benzoate, ammonium benzoate, tetraalkylammonium benzoate, potassium sorbate, ammonium sorbate, and tetraalkylammonium sorbate.

37. The cleaning composition of claim 34, comprising ammonium citrate, potassium benzoate, and potassium sorbate.

38. The cleaning composition of claim 34, comprising ammonium citrate, ammonium benzoate, and potassium sorbate.

39. A cleaning composition for a semiconductor surface comprising an acidic aqueous solution consisting essentially of: about 0.02 to about 1.5% by weight citric acid, citric acid salt, or a mixture thereof, about 0.005 to about 0.3% by weight antimicrobial agent, and solvent comprising water, the % by wt based on the total weight of the cleaning composition; the antimicrobial agent selected from the group consisting of benzoic acid, sorbic acid, potassium benzoate, ammonium benzoate, tetraalkylammonium benzoate, potassium sorbate, ammonium sorbate, tetraalkylammonium sorbate, methylparahydroxybenzoate, ethylparahydroxybenzoate, propylparahydroxybenzoate, and n-heptylparahydroxybenzoate, sulfur dioxide, potassium bisulfite, and potassium metabisulfite, and an amount of a pH buffering agent for a pH of about 5-6.5.

40. A cleaning composition for cleaning a planarized or polished surface of a semiconductor wafer, the composition consisting essentially of:
a mixture of about 0.02-1.5% by wt of a cleaning agent, an antimicrobial agent selected from the group consisting of benzoic acid, sorbic acid, and salts thereof, and about 90-99% by wt solvent in amounts relative to one another to to effectively inhibit microbial growth within the cleaning composition, and an amount of a pH buffering agent for a pH of about 5-6.5;
wherein, when the composition is in contact with both a metal material and a dielectric material on the surface of the wafer, the composition is capable of removing residual particles from said surface of the wafer with no significant defects to the metal material or the dielectric material, and inhibiting microbial deposition on the planarized or polished surface, the % by wt based on the total weight of the composition.

41. The cleaning composition of claim 40, wherein the cleaning agent comprises hydroxycarboxylic acid, a hydroxycarboxylic acid salt, or a mixture thereof.

42. The cleaning composition of claim 41, wherein the cleaning agent comprises citric acid, citric acid salt, or a mixture thereof.

43. The cleaning composition of claim 40, wherein the amount of the antimicrobial agent is about 0.005% to about 0.3%.

44. The cleaning composition of claim 40, wherein the antimicrobial agent is selected from the group consisting of benzoic acid, sorbic acid, potassium benzoate, ammonium benzoate, tetraalkylammonium benzoate, potassium sorbate, ammonium sorbate, tetraalkylammonium sorbate, benzoic acid, sorbic acid, ammonium benzoate, potassium benzoate, tetraalkylammonium benzoate, ammonium sorbate, potassium sorbate, and tetraalkylammonium sorbate.

45. The cleaning composition of claim 40, wherein the solvent comprises water, an organic solvent, or a mixture thereof.

46. The cleaning composition of claim 40, wherein the solvent comprises deionized water.

47. The cleaning composition of claim 40, wherein the composition is capable of dispersing residual metal particles selected from the group consisting of copper, aluminum, platinum, titanium, silver, tungsten, and tantalum particles.

48. A cleaning composition for a semiconductor substrate, consisting essentially of: effective amounts of a cleaning agent and at least one antimicrobial agent at about 0.005-0.3% by wt and selected from the group consisting of benzoic acid, sorbic acid, and salts thereof, effective amounts of at least one of a surfactant, corrosion inhibitor, chelating agent, oxidizing agent and antioxidant, and about 90-99% by wt of a solvent,
and an amount of a pH buffering agent for a pH of about 5-6.5, the % by wt based on the total weight of the composition.

49. A cleaning composition for a semiconductor substrate, consisting essentially of: effective amounts of a cleaning agent and at least one antimicrobial agent at about 0.005-0.3% by wt and selected from the group consisting of benzoic acid, sorbic acid, and salts thereof, effective amounts of at least one of a surfactant, corrosion inhibitor, chelating agent, oxidizing agent and antioxidant; and about 90-99% by wt of solvent comprising water, and an amount of a pH buffering agent for a pH of about 5-6.5, the % by wt based on the total weight of the composition; wherein microbial growth within the cleaning composition is inhibited and, upon contact with the substrate, contaminants on the substrate are dispersed within the composition.

50. A cleaning composition for a semiconductor substrate, consisting essentially of: effective amounts of about 0.02-1.5% by wt of a cleaning agent, about 0.005-0.3% by wt of an antimicrobial agent selected from the group consisting of benzoic acid, sorbic acid, and salts thereof, and about 90-99% by wt solvent to remove residual particles from the substrate and inhibiting microbial deposition onto the substrate, and an amount of a pH buffering agent for a pH of about 5-6.5 the % by wt based on the total weight of the composition.

51. A cleaning composition for a semiconductor substrate, consisting essentially of: effective amounts of a cleaning agent, antimicrobial agent at about 0.005-0.3% by wt and selected from the group consisting of benzoic acid, sorbic acid, and salts thereof, and solvent at about 90-99% by wt, and an amount of a pH buffering agent for a pH of about 5-6.5, the % by wt based on the total weight of the composition; wherein the composition is effective to remove residual particles from the substrate, the residual particles comprising at least one of residual metal particles, abrasive particles, and dielectric particles.

52. A cleaning composition for a semiconductor substrate, consisting essentially of: effective amounts of a cleaning agent at about 0.02-1.5% by wt, antimicrobial agent selected from the group consisting of benzoic acid, sorbic acid, and salts thereof, and solvent at about 90-99% by wt, and an amount of a pH buffering agent for a pH of about 5-6.5, the % by wt based on the total weight of the composition; wherein the composition is effective to remove residual particles from the substrate, the residual particles comprising at least one of metal particles and abrasive particles.

53. The cleaning composition of claim 52, wherein the composition is effective to remove residual metal particles selected from the group consisting of copper particles, aluminum particles, platinum particles, titanium particles, and tantalum particles.

54. A cleaning composition for a semiconductor substrate, consisting essentially of: effective amounts of a cleaning agent, antimicrobial agent selected from the group consisting of benzoic acid, sorbic acid, and salts thereof, an amount of a pH buffering agent for a pH of about 5-6.5, and about 90-99% by weight solvent to effectively remove residual particles from the substrate and inhibit microbial deposition onto the substrate when applied thereto, the % by wt based on the total weight of the composition.

55. A cleaning composition for a semiconductor substrate, consisting essentially of: effective amounts of a cleaning agent, antimicrobial agent selected from the group consisting of benzoic acid, sorbic acid, and salts thereof, buffering agent, and about 90-99% by wt solvent to effectively remove residual particles from the substrate and inhibit microbial deposition onto the substrate when applied thereto, the composition having a pH of about 5-6.5, and the % by wt based on the total weight of the composition.

56. A cleaning composition for a semiconductor substrate, consisting essentially of: effective amounts of a cleaning agent and at least one antimicrobial agent selected from the group consisting of benzoic acid, sorbic acid, and salts thereof effective amounts of at least one of a surfactant, buffering agent, corrosion inhibitor, chelating agent, oxidizing agent, and antioxidant; and solvent at about 90-99% by wt, to effectively remove residual particles from the substrate and inhibit microbial deposition onto the substrate when applied thereto, the composition having a pH of about 5-6.5, and the % by wt based on the total weight of the composition.

57. A cleaning composition for a semiconductor substrate, consisting essentially of: effective amounts of a cleaning agent, antimicrobial agent, about 90-99% by weight solvent, and an amount of a pH buffering agent for a pH of about 5-6.5 to effectively remove residual particles from the substrate and inhibit microbial deposition onto the substrate, and the antimicrobial agent consisting essentially of a mixture of sorbic acid or salt thereof and benzoic acid or salt thereof, the % by wt based on the total weight of the composition.

58. A cleaning composition for a semiconductor substrate, consisting essentially of: effective amounts of a cleaning agent at about 0.02-1.5% by wt, antimicrobial agent at about 0.005-0.3% by wt, buffering agent, and solvent at about 90-99% by wt to effectively remove residual particles from the substrate and inhibit microbial deposition onto the substrate, the composition having a pH of about 5-6.5, and the antimicrobial consisting essentially of a mixture of sorbic acid or salt thereof and benzoic acid or salt thereof, the % by wt based on the total weight of the composition.

59. A cleaning composition for a semiconductor substrate, consisting essentially of: effective amounts of a cleaning agent and at least one antimicrobial agent at about 0.005-0.3% by wt; effective amounts of at least one of a surfactant, buffering agent, corrosion inhibitor, chelating agent, oxidizing agent, and antioxidant; and solvent at about 90-99% by wt, the composition having a pH of about 5-6.5, and the antimicrobial agent consisting essentially of a mixture of sorbic acid or salt thereof and benzoic acid or salt thereof, the % by wt based on the total weight of the composition; wherein microbial growth within the cleaning composition is inhibited and, upon contact with the substrate, contaminants on the substrate are dispersed within the composition.

* * * * *

UNITED STATES PATENT AND TRADEMARK OFFICE
CERTIFICATE OF CORRECTION

PATENT NO.         : 7,468,105 B2
APPLICATION NO.    : 09/981431
DATED              : December 23, 2008
INVENTOR(S)        : Andreas Page 1 of 1

It is certified that error appears in the above-identified patent and that said Letters Patent is hereby corrected as shown below:

In column 13, line 48, in Claim 40, after "to" delete "to".

In column 14, line 49, in Claim 50, after "5-6.5" insert -- , --.

In column 15, line 32, in Claim 56, delete "thereof" and insert -- thereof; --, therefor.

Signed and Sealed this

Seventh Day of April, 2009

JOHN DOLL
*Acting Director of the United States Patent and Trademark Office*